United States Patent
Hoebel et al.

(10) Patent No.: US 7,586,061 B2
(45) Date of Patent: Sep. 8, 2009

(54) METHOD OF CONTROLLED REMELTING OF OR LASER METAL FORMING ON THE SURFACE OF AN ARTICLE

(75) Inventors: Matthias Hoebel, Windisch (CH); Bernd Fehrmann, Baden (CH)

(73) Assignee: ALSTOM Technology Ltd., Baden (CH)

( * ) Notice: Subject to any disclaimer, the term of this patent is extended or adjusted under 35 U.S.C. 154(b) by 523 days.

(21) Appl. No.: 10/920,715

(22) Filed: Aug. 18, 2004

(65) Prior Publication Data
US 2005/0040147 A1 Feb. 24, 2005

Related U.S. Application Data

(63) Continuation of application No. PCT/CH03/00098, filed on Feb. 10, 2003.

(30) Foreign Application Priority Data
Feb. 20, 2002 (EP) .................. 02405126

(51) Int. Cl.
*B23K 26/03* (2006.01)
(52) U.S. Cl. .............. 219/121.83; 148/525; 148/565; 219/121.64; 219/121.66
(58) Field of Classification Search ........... 219/121.62, 219/121.63, 121.64, 121.83, 121.66; 148/525; 148/565; 117/95, 97, 98, 103, 108
See application file for complete search history.

(56) References Cited

U.S. PATENT DOCUMENTS

| | | | |
|---|---|---|---|
| 3,690,367 A | | 9/1972 | Daniels |
| 4,323,756 A | | 4/1982 | Brown et al. |
| 4,555,610 A | * | 11/1985 | Polad et al. ............ 219/121.62 |
| 4,922,412 A | * | 5/1990 | Lane et al. ............... 700/37 |
| 4,960,501 A | | 10/1990 | Sivilotti |
| 5,071,059 A | * | 12/1991 | Heitman et al. .......... 29/889.72 |
| 5,142,778 A | * | 9/1992 | Smolinski et al. ....... 219/121.66 |
| 5,155,329 A | * | 10/1992 | Terada et al. ........... 219/121.83 |
| 5,562,842 A | * | 10/1996 | Laferriere .............. 219/121.83 |
| 5,580,471 A | * | 12/1996 | Fukumoto et al. ....... 219/121.63 |
| 5,622,638 A | | 4/1997 | Schell et al. ........... 219/121.64 |

(Continued)

FOREIGN PATENT DOCUMENTS

DE 4005314 A1 * 8/1991

(Continued)

OTHER PUBLICATIONS

Mazumder et al., 2000, "Closed loop direct metal deposition: art to part", Optics and Lasers in Engineering, vol. 34, pp. 397-414.*

(Continued)

*Primary Examiner*—Geoffrey S Evans
(74) *Attorney, Agent, or Firm*—Cermak Kenealy Vaidya & Nakajima LLP; Adam J. Cermak

(57) ABSTRACT

A method for controlled remelting of or laser metal forming on the surface (5) of an article (1) can include moving a light source and a signal capturing apparatus over the article (1). The light source having a specific power can be used to melt the surface (5) of the article (1) locally and to form a melt pool (7). Thereby an optical signal (13) is captured by the signal capturing apparatus from the melt pool (7), and the monitored optical signal (13) is used for the determination of temperature and temperature fluctuations as properties of the melt pool (7). Furthermore, a control system (16) with a feedback circuit is used to adjust at least one process parameter such as the power of the light source such that desired melt pool properties are obtained. Subsequently the melt pool (7) solidifies.

19 Claims, 3 Drawing Sheets

U.S. PATENT DOCUMENTS

| | | | |
|---|---|---|---|
| 5,659,479 A * | 8/1997 | Duley et al. | 700/166 |
| 5,837,960 A | 11/1998 | Lewis et al. | |
| 5,914,059 A | 6/1999 | Marcin, Jr. et al. | |
| 6,024,792 A | 2/2000 | Kurz et al. | 117/9 |
| 6,046,426 A | 4/2000 | Jeantette et al. | 219/121.63 |
| 6,122,564 A | 9/2000 | Koch et al. | 700/166 |
| 6,277,500 B1 | 8/2001 | Konter et al. | |
| 6,311,099 B1 | 10/2001 | Jasper et al. | 700/166 |
| 6,998,568 B2 * | 2/2006 | Brehm et al. | 219/121.64 |
| 7,043,330 B2 * | 5/2006 | Toyserkani et al. | 700/166 |
| 2006/0081571 A1 * | 4/2006 | Hoebel et al. | 219/121.64 |

FOREIGN PATENT DOCUMENTS

| | | |
|---|---|---|
| DE | 41 26 351 A1 | 2/1993 |
| DE | 4234342 A1 * | 4/1994 |
| DE | 198 53 733 C1 | 2/2000 |
| DE | 199 49 972 C1 | 2/2001 |
| EP | 0 558 870 A1 | 9/1993 |
| EP | 0 740 976 A1 | 11/1996 |
| EP | 0 740 977 A1 | 11/1996 |
| EP | 0 749 790 A1 | 12/1996 |
| EP | 1 001 055 A1 | 5/2000 |
| WO | 95/06540 | 3/1995 |
| WO | 95/35396 | 12/1995 |
| WO | 03/070414 A1 | 8/2003 |

OTHER PUBLICATIONS

Meriaudeau et al., 1996,"Image Processing Applied to Laser Cladding Process" SPIE vol. 2789, pp. 93-103.*

Romer, thesis of "Modelling and Control of Laser Surface Treatment",1999, Printed by Printed by Print Partners Ipskamp, pp. i-v of preface, pp. 1-5,7-15,17-41,43-127,129-163,165-192. ISBN 90-365-1304-9.*

Search Report from PCT/CH 03/00098 (Apr. 29, 2003).

Search Report from EP 02 40 5126 (Aug. 21, 2002).

IPER from PCT/CH 03/00098 (Dec. 10, 2003).

Ma, Dexin, Peter R. Sahm. Einkristallerstarrung der Ni-Basis-Superlegierung SRR 99. *Zeitschrift für Metallkunde* 11 (1991): 869-873.

* cited by examiner

METHOD OF CONTROLLED REMELTING OF OR LASER METAL FORMING ON THE SURFACE OF AN ARTICLE

This application is a Continuation of, and claims priority under 35 U.S.C. §120 to, International application number PCT/CH03/00098, filed 10 Feb. 2003, and claims priority under 35 U.S.C. §119 to European application number 024 05 126.0, filed 20 Feb. 2002, the entireties of which are incorporated by reference herein.

BACKGROUND OF THE INVENTION

1. Field of the Invention

The invention relates to methods of controlled remelting of or laser metal forming on the surface of articles.

2. Brief Description of the Related Art

In the last years laser metal forming (LMF) has been introduced in industrial manufacturing. Laser metal forming is a process where a high power laser locally melts a focused stream of metal powder or a metal wire 20 onto a substrate. In this way material can be added to the underlying part. The method is suitable for controlled material build-up and the laser generated parts are characterized by a dense microstructure which is usually free of pores.

Laser metal forming has been recently used for commercial manufacturing of superalloys due to its attractive potential for repair of locally damaged or worn parts. Indeed, it is possible to selectively add material at desired locations and to re-establish the full functionality of a component. It is clear that laser repair technology is particularly attractive for the refurbishment of expensive parts that are affected by local damage or local mechanical wear. Turbine blades and vanes are typical examples.

However, the process is complicated when single-crystal components have to be refurbished. Single crystal blades and vanes can be found in the most heavily loaded rows of modern gas turbines (first or high pressure row). Their mechanical integrity relies on the particular properties due to single-crystal microstructure and the absence of grain boundaries. Reconditioning of such components is only feasible if the single crystal microstructure can be maintained during the repair process.

During laser metal forming substrate material is locally molten and powder (or wire 20) is injected into the melt pool with a suitable powder (or wire 20) feeder mechanism. After a certain interaction time (which is determined by the laser spot size and the relative movement between laser and substrate) the molten material resolidifies leading to material build-up on the substrate.

However, during the solidification of the molten material new grains may form in the melt pool due to constitutional undercooling of the liquid melt. The growth of these newly formed grains leads to undesired build-up of equiaxed material, i.e. material that is oriented in a random manner. As the thermomechanical properties of superalloys greatly depend on the crystallographic orientation and as SX crystal components rely on the benefit of preferable orientation it is obvious that the consequence of equiaxed growth is a serious degradation of the mechanical properties. Moreover, superalloys which do not contain grain boundary stabilizing elements exhibit excessive creep when unwanted grain boundaries are formed. For epitaxial laser metal forming it is therefore crucial to ensure a completely SX microstructure of a part by avoiding the so-called columnar to equiaxed transition (CET).

One strategy for ensuring epitaxial growth, i.e. growth with orientation matched to the substrate and without formation of new grains, is to use special process conditions. Laser parameters have to be adjusted in a manner that a specific ratio between temperature gradient G and the solidification speed Vs is maintained. Both quantities depend not only on laser parameters such as power, power density, advance speed but also on the properties of the substrate and powder (or wire 20) material.

Those skilled in the art of laser metal forming are also aware that the onset of (marangoni) convection in the melt pool is one of the main reasons for the undesired CET. Initiation of convection processes in the melt pool leads to fragmentation of the fragile dendrites that form during the solidification of the molten material. By the effect of convective transport dendrite fragments are distributed all over the melt pool where they acts as nucleation sites and promote the formation of equiaxed material.

Unfortunately melt pool convection is also affected by other process parameters like mass feed rate, protection gas stream, injection angle. In addition, marangoni convection is not readily detectable without melt pool monitoring.

So far, several patents have been issued for the laser metal forming process. The basic principle is described in EP-A1-0 558 870, DE-C1-199 49 972, U.S. Pat. No. 5,873,960, U.S. Pat. No. 5,622,638 or U.S. Pat. No. 4,323,756.

The application of epitaxial material build-up for protective coatings is covered by U.S. Pat. No. 6,277,500, applications for generation or refurbishment of single crystal components are described in U.S. Pat. No. 6,024,792, EP-A1-0 740 977, WO95/35396 or U.S. Pat. No. 5,914,059. Except U.S. Pat. No. 6,024,792 none of these patents mentions the significance of the G, Vs parameters in order to obtain the desired single crystal microstructure. U.S. Pat. No. 6,024,792 states that the laser power has to be set in a way to obtain adequate values for G and Vs, however, does not suggest a method for automatic laser power control or for avoiding melt pool convections.

Another patent application, WO95/06540 suggests the use of a pyrometer for interactive laser welding of super alloy articles measuring the substrate preheating temperature.

The collection of optical signals from the melt pool is also depicted in U.S. Pat. No. 6,122,564. In this patent, an optical monitoring system is connected to a feedback controller in order to adjust the material deposition rate depending on the indicated height of previously deposited material.

In U.S. Pat. No. 6,311,099 an apparatus for regulating laser welding parameters is suggested that uses optical signals from the interaction zone. In this patent the optical signal is generated by near infrared radiation originating from the weld pool. The radiation is detected by a CCD camera and processed in order to obtain information about the physical dimensions of the melt pool.

SUMMARY OF THE INVENTION

According to an aspect of the invention, an advanced method for controlled deposition or remelting of material on substrates avoids hot tearing defects, the columnar to equiaxed transition (CET) and melt pool convection. With material it should be possible to deposit material on single crystal substrates epitaxial with the base material or to transform a previously polycrystalline surface layer into single crystal material.

In accordance with another aspect of the invention, a method can include remelting of the surface of an article and can also include laser metal forming on the surface of an article.

The method can be used for remelting substrate material in order to re-establish a single crystal microstructure in the surface zones of the substrate, to transform a previously polycrystalline surface layer into single crystal material, to coat single crystal articles with a single crystal coating or for the repair of single crystal turbine components. Due to matched thermo-physical properties of solidified and base material the method leads to reduced stress and therefore to greater lifetime of the components.

With the online monitoring system and using automatic feed-back control of at least one process parameter such as laser power it is possible to establish and maintain optimum process conditions. In this favorable case the columnar to equiaxed transition (CET) and melt pool convection are avoided and a temperature field is created in the melt pool which leads to defect-free, epitaxial growth of the deposited material. Thus, it is possible to add new material without creation of grain boundaries. Beside the laser power process parameters like the relative speed between laser beam and the substrate, the carrier gas flow and mass feed rate of added material can be controlled.

Preferably a fibre coupled high power diode laser is used as a light source. The inventive method combines laser power delivery, material supply and process monitoring in a dedicated laser/powder head. With this device the powder injection can be concentric with respect to the cone of captured optical signals from the melt pool or the cone of captured optical signals from the melt pool concentric with respect to the light source focusing cone. With the help of a dichroitic mirror infrared (IR) radiation from the melt pool is collected through the same optics which is used for laser focusing. The dichroitic mirror transmits laser light and reflects process light or vice versa.

The process signal from the melt pool can be coupled to a pyrometer or another fiber-coupled detector. For this purpose the optical properties of the monitoring system are chosen such that the measurement spot is smaller than the melt pool and located at the center of the melt pool. In a preferred embodiment according to the invention the optical signal is captured from the center and vicinity of the laser focal spot using a single optical fiber, an imaging fiber bundle or a charged coupled device (CCD) camera that is equipped with suitable optical filters. This information is used to determine the temperature a single spot or simultaneously at several locations in the center and in the vicinity of the melt pool. In a second case temperature gradients in the laser interaction zone can be analyzed.

The online feed back control of the laser power is decoupled from the main process control by means of a separate microprocessor. This allows faster parallel processing in real-time, i.e. independent from the operating system.

In another embodiment post-processing of the optical signal from the melt pool is used for quality control: The analysis of the measured data allows optimizing process parameters such that a desired microstructure is obtained. Recording of monitoring signals serves also for documentation purposes and for ensuring consistent product quality.

Moreover, dedicated commercially available software tools with enhanced functionality can be used for the realization of the control system. As a consequence short loop times and advanced PID control features such as gain scheduling can be realized.

Still other objects, features, and attendant advantages of the present invention will become apparent to those skilled in the art from a reading of the following detailed description of embodiments constructed in accordance therewith, taken in conjunction with the accompanying drawings.

BRIEF DESCRIPTION OF THE DRAWINGS

The invention of the present application will now be described in more detail with reference to preferred embodiments of the apparatus and method, given only by way of example, and with reference to the accompanying drawings, in which.

DETAILED DESCRIPTION OF PREFERRED EMBODIMENTS

Figure 1:
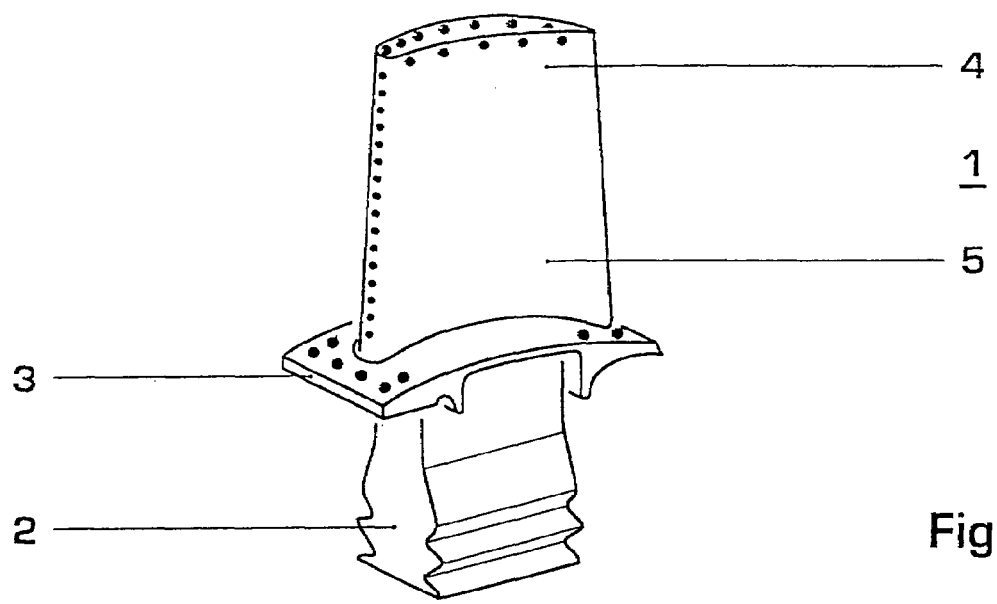
FIG. 1 illustrates a gas turbine blade.

Referring to the drawing figures, like reference numerals designate identical or corresponding elements throughout the several figures.

FIG. 1 shows a single crystal (SX) or directionally solidified (DS) article 1 such as blades or vanes of gas turbine engines, the gas turbine blade comprising a root portion 2, a platform 3 and a blade 4 and having a surface 5. The article 1 can as an example be made from a nickel or cobalt based super alloy. Investment casting methods for producing such SX or DS articles are known e.g. from U.S. Pat. No. 4,96,501, U.S. Pat. No. 3,690,367 or EP-A1-0 749 790, which are incorporated herein by reference. These articles 1 are normally made from a nickel or cobalt base super alloy.

The herein disclosed method can be used for remelting substrate material of the article 1 in order to re-establish a single crystal (SX) microstructure in the surface zones of the substrate or to transform a previously polycrystalline surface layer into SX material. In addition this method can be used for SX-coating application on SX-articles 1 or for the repair of single crystal (SX) turbine components. The underlying single crystal bulk material will act as a crystal seed for the remolten material. Due to matched thermo-physical properties the method leads to reduced stress and therefore to greater lifetime of the components.

It can be seen from the previous paragraph that high thermal gradients with the melt pool 7 are crucial for single crystal solidification. For this reason high power lasers such as $CO_2$, (fibre coupled) Nd—YAG or (fibre coupled) high power diode lasers offer a particularly attractive choice as a light source. Laser radiation can be focussed to small spots and generate thermal gradients in excess of $10^6$ K/m. It is beneficial if the laser intensity is uniform over the heated area, which can be achieved by fiberoptic beam delivery. As laser power is very easily controlled, it is ensured that the criterion for single crystal solidification is maintained during the whole operation.

If during this operation the ratio $G^n/V_s$ (where G is the temperature gradient in the melt pool, n is a material constant and $V_s$ is the solidification speed) is kept above a material dependent threshold value, the subsequent solidification will occur epitaxially, i.e. without creating new grain boundaries.

In a typical application the laser will be focussed to a spot size of 1-3 mm diameter. Preferably the laser would be either of the Nd—YAG or high power diode laser type. These lasers operate in the near infrared and about 30-40% of the incident radiation is absorbed by typical super alloys. The laser beam will move at relatively slow speeds (approx. 1-10 mm/s) over the affected zones and operate in the conduction welding mode. Laser intensities of $1*10^3$ W/cm$^2$ to $5*10^4$ W/cm$^2$ will remelt a zone reaching up to 500 □m below the surface. Larger penetration depths can be achieved by further reducing the processing speed or by preheating the article 1 prior to the melting of the surface 5 to a desired temperature in the range of 500-1000° C., e.g. with a high frequency generator. On preheated articles, however, thermal gradients are smaller and it is more difficult to meet the $G''/V_s$ criterion. On the other hand the risk of hot tearing defects during the whole operation is reduced. The area on the substrate which is directly heated by the light source is known as a light source interaction zone.

Figure 2:
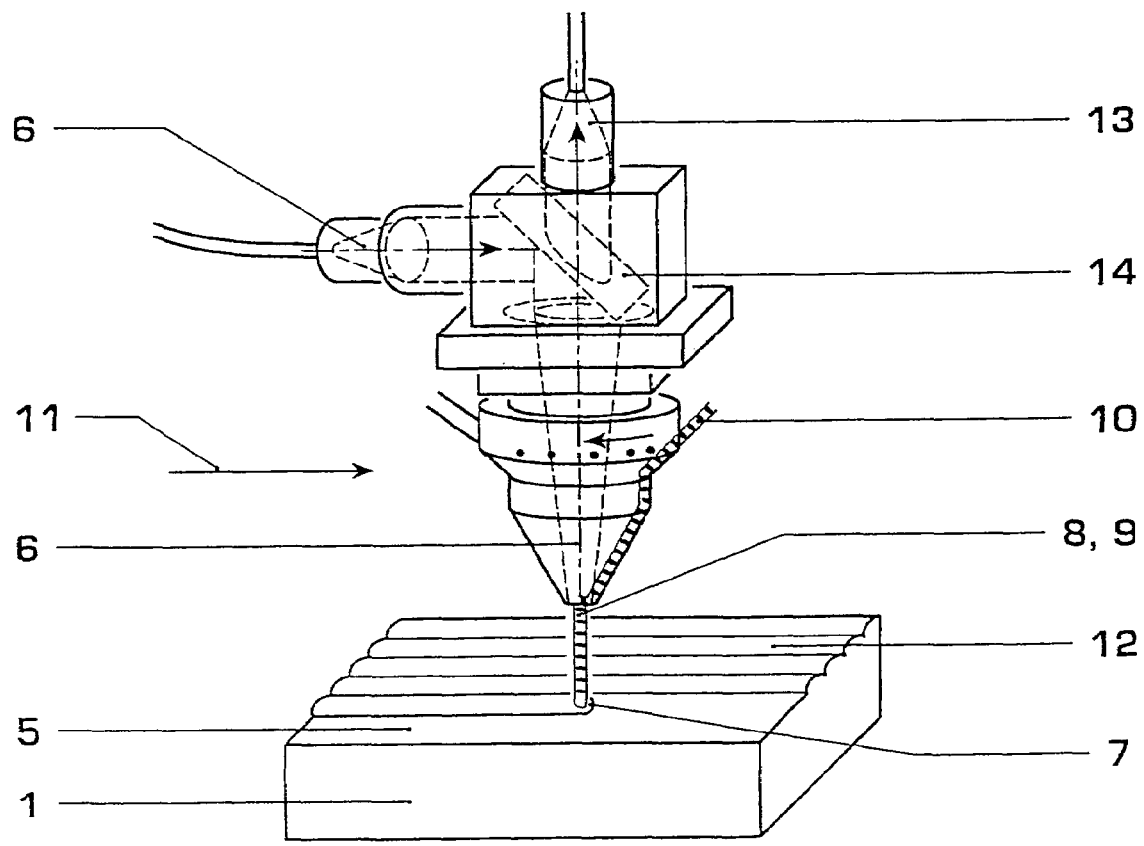
FIG. 2 illustrates an apparatus for carrying out a method of the present invention.

FIG. 2 shows as an example an apparatus for controlled laser metal forming on the surface 5 of the article 1 according to the present invention. A laser beam 6 is moved over the surface 5 of the article 1 (or the article 1 is moved relative to the laser beam) thereby locally melting the surface 5 to form a melt pool 7. For coating or other laser metal forming applications material in the form of jet of powder 8 with a carrier gas 9 by means of a feeder 10 or a wire 20 is added to the melt pool 7. From the melt pool 7 an optical signal 13 is continuously captured and used for the determination of the temperature, the temperature fluctuations and existing temperature gradients as properties of the melt pool 7. In one embodiment as seen in FIG. 2 the powder 8 injection can be concentric with respect to the cone of captured optical signals 13 from the melt pool 7.

Figure 3:
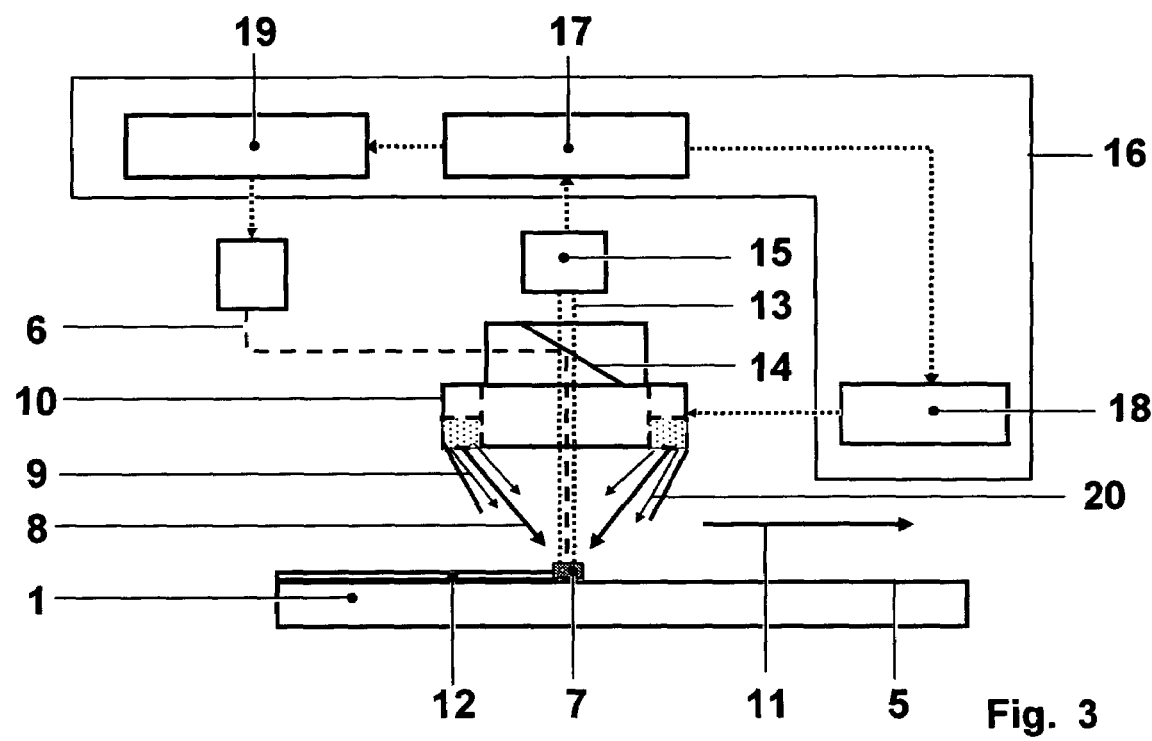
FIG. 3 illustrates an embodiment of an overall control system for carrying out the invention.

As seen from the FIG. 3, the information of the optical signal 13 is used in a feedback circuit within a control system 16 to adjust process parameter such as the laser power by means of a controller 19, the relative speed between the laser beam 6 and the substrate, the flow rate of the carrier gas 9 and the mass feed rate of the injected powder 8 by means of a controller 18 in a way that desired melt pool 7 properties are obtained. For the method of remelting of the surface 5 of the article one or a combination of the process parameters laser power and/or the relative speed between the laser beam 6 and the article 1 is used. Subsequently the melt pool 7 solidifies as indicated in FIG. 2 with reference number 12.

The method uses a combination of a concentric feeder 10, a fiber coupled laser and an on-line monitoring system with real time capability. With the help of the online monitoring system optimum process conditions are established and maintained where the columnar to equiaxed transition (CET) and melt pool convection are avoided. Hence, defect-free, epitaxial growth of the deposited material is observed. It is thus possible to add new material without creation of grain boundaries.

The method combines laser power delivery, material supply and process monitoring in a dedicated laser/powder head as shown in FIG. 2. With the help of a dichroic mirror 14 infrared (IR) radiation from the melt pool 7 is collected through the same optics which is used for laser focusing. The dichroic mirror 14 transmits laser light and reflects process light of the optical signal 13 or vice versa.

The optical signal 13 from the melt pool 7 is coupled to a pyrometer 15 or another fiber-coupled detector which allows the online determination of the melt pool temperature. For this purpose the optical properties of the monitoring system are chosen such that the measurement spot is smaller than the melt pool and located at the center of the melt pool 7. In another embodiment according to the invention the optical signal 13 is captured from the center and vicinity of the laser focal spot using an imaging fibre bundle or a charged coupled device (CCD) camera that is equipped with suitable optical filters. This information is used to determine the temperature a single spot or simultaneously at several locations in the center and in the vicinity of the melt pool. In a second case temperature gradients in the laser interaction zone can be analyzed.

The cone of captured optical signals 13 from the melt pool 7 can be concentric with respect to the laser focusing cone. The symmetry of this arrangement ensures that laser-powder interaction does not change during movements on complex shaped components. This leads to consistent high quality of the process.

FIG. 3 shows the overall control system 16 for carrying out an aspect of the invention. Besides a main process control 16 a controller 18 for controlling the feeder 10 and the whole apparatus and a controller 19 for controlling the laser is provided. The temperature information is used for the adjustment of process parameters such as the laser power, the relative speed between the laser beam 6 and the article 1, the feed rate of the injected powder 8 with the carrier gas 9 or an injected wire 20. For the method of remelting of the surface 5 of the article only one or a combination of the process parameters laser power and/or the relative speed between the laser beam 6 and the article 1 is used. This automatic feed-back control of the laser power by means of the controller 19 allows establishment of a temperature field which is favorable for epitaxial growth. Moreover, the monitored optical signal 13 from the melt pool 7 allows detection of the onset of marangoni convection. Avoiding marangoni convection in the melt pool 7 will reduce the risk of hot tearing defects during solidification of the molten material.

As seen in FIG. 3, the online feed back controller 19 of the laser power is decoupled from the main process control 17 by means of a separate microprocessor. This allows faster parallel processing in real-time, i.e. independent from the operating system.

In another embodiment postprocessing of the optical signal 13 from the melt pool 7 is used for quality control: The analysis of the measured data allows optimizing process parameters such that a desired microstructure is obtained. Recording of monitoring signals serves also for documentation purposes and for ensuring consistent product quality.

Moreover, dedicated commercially available software tools (e.g. LabView RT) with enhanced functionality can be used for the realization of the control system 16. As a consequence loop times <10 ms and advanced PID control features such as gain scheduling, which means the use of different sets of PID parameters in predefined temperature intervals can be realized.

Figure 4:
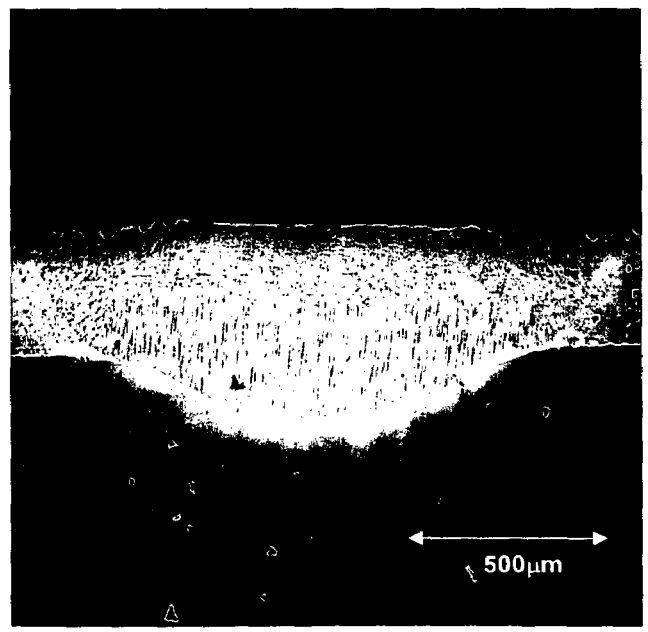
FIG. 4 illustrates an example of a structure treated in accordance with an embodiment of the invention.

An example of a structure treated in accordance with an embodiment of the invention is shown in FIG. 4, in which a 300 μm polycrystalline surface layer (of plasma sprayed coating material) was remelted and transformed into an epitaxially solidified surface layer. The matched orientation of the (fine) dendrites in the remolten area can be seen. Laser parameters were: P=220 W, v=1 mm/s, spot diameter: 2.5 mm.

Figure 5:
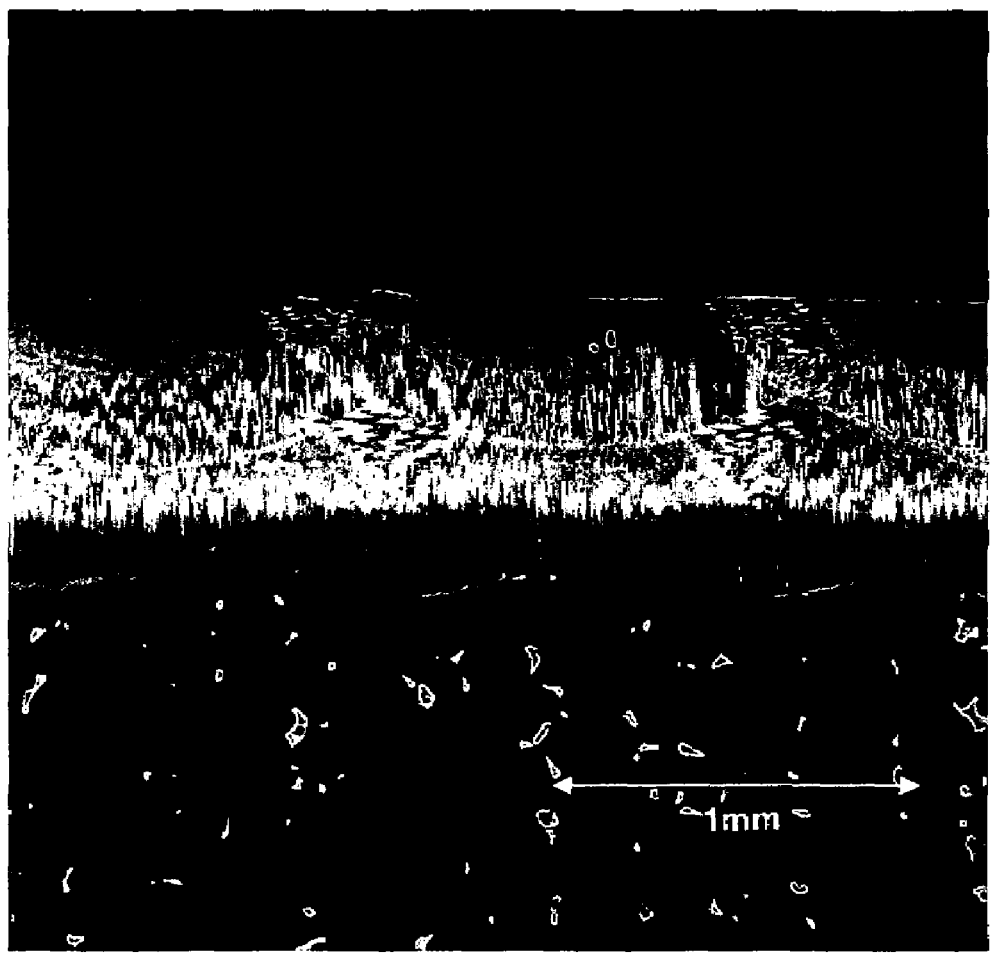
FIG. 5 illustrates another example of a structure treated in accordance with an embodiment of the invention.

Another example of a structure treated in accordance with an embodiment of the invention is shown in FIG. 5, where a 550 μm SX protection layer is deposited on a part made of SX turbine material. A subsequent re-melting step re-melts the surface layer of the deposit and leads to a very smooth surface finish and improved quality of the microstructure. In this case process parameters were: P=270 W, v=2 mm/s, powder feed rate: 2.4 g/min, laser spot diameter 1.8 mm for the deposition step and P=240 W, v=4 mm/s, laser spot diameter: 2.5 mm for the subsequent re-melting step.

REFERENCE NUMBERS

1 Article, e.g. blades or vanes for gas turbines
2 Root portion
3 Platform
4 Blade
5 Surface of article 1
6 Laser beam
7 Melt pool
8 Powder
9 Carrier gas
10 Feeder
11 Direction of movement
12 Solidified material
13 Optical signal
14 Dichroic mirror
15 Pyrometer
16 Control system
17 Main process control
18 Controller for feeder 10
19 Controller for laser
20 Wire While the invention has been described in detail with reference to preferred embodiments thereof, it will be apparent to one skilled in the art that various changes can be made, and equivalents employed, without departing from the scope of the invention. Each of the aforementioned documents is incorporated by reference herein in its entirety.

What is claimed is:

1. A method for controlled remelting of a surface of an article, comprising:
providing a light source, a signal capturing apparatus, a control system, and a feedback circuit;
moving the light source, the signal capturing apparatus and the article relative to each other;
melting a portion of the surface of the article using the light source;
injecting a powder into the melt pool;
forming a melt pool;
capturing an optical signal from the melt pool using the signal capturing apparatus;
using the optical signal to determine properties including temperature of the melt pool and temperature fluctuations of the melt pool;
using the properties from the optical signal within the feedback circuit of the control system to adjust one of light source power and relative speed of the light source to the article such that desired melt pool properties are obtained;
adjusting one of the temperature and the temperature fluctuations of the melt pool such that melt pool properties are obtained to avoid Marangoni convection in the melt pool, and
solidifying the melt pool.

2. The method of claim 1, further comprising:
adjusting one of the temperature and the temperature fluctuations of the melt pool such that melt pool properties are obtained to avoid columnar to equiaxed transition (CET) during solidification of the melt pool.

3. The method of claim 1, wherein one of the light source and the article is moved with respect to the other of the light source and the article.

4. The method of claim 1, further comprising:
providing a light source power control that includes a controller and processor; and
providing a main process control that includes a processor, wherein the light source power control processor is different from the main process control processor.

5. The method of claim 4, further comprising:
operating the light source power controller in real time.

6. The method of claim 1, further comprising:
using gain scheduling for predefining PID control parameters within the control system.

7. The method of claim 1, further comprising:
post-processing the optical signal from the melt pool for quality control purposes, optimization of process parameters, process documentation, or combinations thereof.

8. The method of claim 1, further comprising:
directing the captured optical signal from the melt pool to a pyrometer.

9. The method of claim 1, further comprising:
capturing the optical signal by a fiber-coupled detector.

10. The method of claim 1, further comprising:
capturing the optical signal from an approximate central focal spot of the light source;
using one of an optical fiber, an imaging fibre bundle, and a CCD camera to capture the optical signal;
using the optical signal to determine the temperature at a plurality of locations in an approximate central location of the melt pool; and
determining temperature gradients in a light source interaction zone and its vicinity.

11. The method of claim 1, wherein a cone from which optical signals are captured from the melt pool is concentric with respect to a cone in which the light source is focused.

12. The method of claim 1, further comprising:
providing a dichroic mirror;
using the dichroic mirror to either transmit light from the light source and reflect light of the optical signal, or, transmit light from the optical signal and reflect light of the light source.

13. The method of claim 1, further comprising:
using a fibre coupled high power diode laser as a light source.

14. The method of claim 1, wherein the article is a gas turbine component made from a nickel or cobalt base super alloy.

15. A method according to claim 1, further comprising:
maintaining the ratio $G^n/V_s$ above a material-dependent threshold value;
wherein G is the temperature gradient in the melt pool, n is a material constant, and $V_s$ is the solidification speed.

16. A method for controlled remelting of a surface of an article, comprising:
providing a light source, a signal capturing apparatus, a control system, and a feedback circuit;
moving the light source, the signal capturing apparatus and the article relative to each other;
melting a portion of the surface of the article using the light source;
injecting a powder into the melt pool;
forming a melt pool;
capturing an optical signal from the melt pool using the signal capturing apparatus;
using the optical signal to determine properties including temperature of the melt pool and temperature fluctuations of the melt pool;

using the properties from the optical signal within the feedback circuit of the control system to adjust one of light source power and relative speed of the light source to the article such that desired melt pool properties are obtained;

wherein melting a portion of the surface of the article comprises remelting only the surface of the article thereby either re-establishing a single crystal (SX) micro structure or transforming a polycrystalline surface layer into a single crystal (SX) structure; and solidifying the melt pool.

17. A method according to claim 16, further comprising:

maintaining the ratio $G^n/V_s$ above a material-dependent threshold value;

wherein G is the temperature gradient in the melt pool, n is a material constant, and $V_s$ is the solidification speed.

18. A method for controlled laser metal forming on a surface of an article, comprising:

providing a light source, a signal capturing apparatus, a control system, and a feedback circuit;

moving one of the light source, the signal capturing apparatus, and the article relative to each other, thereby;

melting the surface of the article using the light source, and forming a melt pool;

injecting a powder into the melt pool;

capturing an optical signal from the melt pool using the signal capturing apparatus;

using the optical signal to determine melt pool properties, including temperature and temperature fluctuations;

adjusting process parameters, based on the determined temperature and temperature fluctuations of the melt pool from the optical signal within the control system and in the feedback circuit, said process parameters including at least one of power of the light source, a relative speed between the light source and the article, and a mass feed rate of the powder, such that melt pool properties are obtained to avoid Marangoni convection in the melt pool; and solidifying the melt pool.

19. A method according to claim 18, further comprising:

maintaining the ratio $G^n/V_s$ above a material-dependent threshold value;

wherein G is the temperature gradient in the melt pool, n is a material constant, and $V_s$ is the solidification speed.

* * * * *